United States Patent
Du

(10) Patent No.: US 10,290,668 B2
(45) Date of Patent: May 14, 2019

(54) IMAGE SENSORS WITH ADJUSTABLE PIXEL DENSITY AND PIXEL DENSITY ADJUSTMENT METHODS THEREOF

(71) Applicant: Beijing Zhigu Rui Tuo Tech Co., Ltd, Beijing (CN)

(72) Inventor: Lin Du, Beijing (CN)

(73) Assignee: BEIJING ZHIGU RUI TUO TECH CO., LTD, Beijing (CN)

( * ) Notice: Subject to any disclaimer, the term of this patent is extended or adjusted under 35 U.S.C. 154(b) by 273 days.

(21) Appl. No.: 15/501,590

(22) PCT Filed: Jul. 24, 2015

(86) PCT No.: PCT/CN2015/084999
§ 371 (c)(1),
(2) Date: Feb. 3, 2017

(87) PCT Pub. No.: WO2016/019810
PCT Pub. Date: Feb. 11, 2016

(65) Prior Publication Data
US 2017/0229499 A1 Aug. 10, 2017

(30) Foreign Application Priority Data
Aug. 6, 2014 (CN) .......................... 2014 1 0382828

(51) Int. Cl.
*H01L 27/146* (2006.01)
*H04N 5/369* (2011.01)

(52) U.S. Cl.
CPC .. *H01L 27/14605* (2013.01); *H01L 27/14603* (2013.01); *H01L 27/14643* (2013.01); *H04N 5/369* (2013.01); *H04N 5/3696* (2013.01)

(58) Field of Classification Search
CPC ......... H01L 27/14605; H01L 27/14643; H01L 27/14603; H04N 5/3696; H04N 5/369

(Continued)

(56) References Cited

U.S. PATENT DOCUMENTS 6,800,838 B2   10/2004   Yamamoto
7,742,090 B2    6/2010   Street et al.
(Continued)

FOREIGN PATENT DOCUMENTS

CN     1591096 A     3/2005
CN   102201422 A     9/2011
(Continued)

OTHER PUBLICATIONS

International Search Report for PCT Application No. PCT/CN2015/084999, dated Oct. 28, 2015, 3 pages.
Choi, et al. "A Spatial-Temporal Multi-Resolution CMOS Image Sensor with Adaptive Frame Rates for Moving Object in the Region-of-Interest" 2007 IEEE International Solid-State Circuits Conference / Session 28 / Image Sensors / 28.2, Feb. 14, 2007, published online at [http://www.ece.umn.edu/groups/iml/publications/2007/ISSCC_Jchoi.pdf], retrieved on Jan. 24, 2017, 3 pages.
(Continued)

*Primary Examiner* — Seung C Sohn
(74) *Attorney, Agent, or Firm* — Amin, Turocy & Watson, LLP

(57) ABSTRACT

Embodiments of the present application disclose image sensors with adjustable pixel density and pixel density adjustment methods thereof, wherein one of the image sensors with adjustable pixel density comprises: a plurality of image sensor pixels array-distributed; and a controllable deformed material portion respectively connected with the plurality of image sensor pixels; the controllable deformed material portion being deformable under the action of an external field and density distribution of the plurality of image sensor pixels being correspondingly adjusted through the deformation. The technical solutions of the embodiments of the present application can achieve adjustable pixel density of the image sensor, performs image acquisition based on the image sensor with adjustable pixel density, and (Continued)

can make full use of overall pixels of the image sensor to present differentiated resolution of different regions of an acquired image, thereby better meeting users' diversified application demands.

20 Claims, 4 Drawing Sheets

(58) Field of Classification Search
USPC ..................................................... 250/208.1
See application file for complete search history.

(56) References Cited

U.S. PATENT DOCUMENTS

| | | | |
|---|---|---|---|
| 8,253,212 B2* | 8/2012 | Wronski | H01L 27/14634 250/214 A |
| 8,416,355 B2* | 4/2013 | Tamir | E06B 9/24 250/205 |
| 9,402,034 B2 | 7/2016 | Price et al. | |
| 2004/0080007 A1 | 4/2004 | Yamamoto | |
| 2008/0151089 A1 | 6/2008 | Street et al. | |
| 2013/0027581 A1 | 1/2013 | Price et al. | |

FOREIGN PATENT DOCUMENTS

| | | |
|---|---|---|
| CN | 102969326 A | 3/2013 |
| CN | 104157660 A | 11/2014 |
| JP | 2006129411 A | 5/2006 |
| JP | 2009194145 A | 8/2009 |

OTHER PUBLICATIONS

"Living Image® Software User's Manual" Caliper LifeSciences, Version 4.2, published online at [http://www2.udel.edu/ctcr/sites/udel.edu.ctcr/files/Living_Image_4-2_User_Guide.pdf], © 2002-2011 Caliper Corporation, retrieved on Jan. 24, 2017, 344 pages.

Ng, et al. "Flexible image sensor array with bulk heterojunction organic photodiode", Applied Physics Letters, 92, 213303 (2008), published online May 28, 2008, retrieved on Jan. 24, 2017, 5 pages.

Ko, et al. "A hemispherical electronic eye camera based on compressible silicon optoelectronics." Nature, vol. 454, Aug. 7, 2008, retrieved on Feb. 1, 2017, 6 pages.

Bar-Cohen. "Electroactive polymers for refreshable Braille displays". SPIE. 10.1117/2.1200909.1738. Sep. 11, 2009. Retrieved on Jan. 24, 2017, 3 pages.

Yu, et al. "Directed bending of a polymer film by light", Nature, vol. 425, Sep. 11, 2003, retrieved on Feb. 1, 2017, 1 page.

* cited by examiner

IMAGE SENSORS WITH ADJUSTABLE PIXEL DENSITY AND PIXEL DENSITY ADJUSTMENT METHODS THEREOF

RELATED APPLICATION

The present application is a U.S. National Stage filing under 35 U.S.C. § 371 of international patent cooperation treaty (PCT) application No. PCT/CN2015/084999, filed Jul. 24, 2015, and entitled "IMAGE SENSORS WITH ADJUSTABLE PIXEL DENSITY AND PIXEL DENSITY ADJUSTMENT METHODS THEREOF", which claims the benefit of priority to Chinese Patent Application No. 201410382828.8, filed on Aug. 6, 2014, which applications are hereby incorporated into the present application by reference herein in their respective entireties.

TECHNICAL FIELD

The present application relates to the field of image acquisition technologies, and in particular, to various image sensors with adjustable pixel density and various pixel density adjustment methods thereof.

BACKGROUND

With continuous development of image acquisition technologies, devices supporting image acquisition are constantly enhanced, and people have increasingly higher requirements for the quality of acquired images.

In order to get a clearer image, an image sensor with higher pixel density may be adopted usually to acquire an image so as to improve the overall resolution of the acquired image, but the size of the image acquired according to the solution may increase correspondingly, which thus increasing the burden of image storage and/or transmission bandwidth resources correspondingly.

SUMMARY

A brief summary about the present application is given hereinafter, so as to provide a basic understanding about certain aspects of the present application. It should be understood that the summary is not an exhaustive summary about the present application. It is neither intended to determine critical or important parts of the present application, nor intended to limit the scope of the present application. Its purpose is merely giving some concepts in a simplified form, to be taken as the preamble to be described later in more detail.

The present application provides image sensors with adjustable pixel density and pixel density adjustment methods thereof.

In one aspect, example embodiments of the present application provide an image sensor with adjustable pixel density, comprising:

a plurality of image sensor pixels array-distributed; and
a controllable deformed material portion respectively connected with the plurality of image sensor pixels; wherein the controllable deformed material portion can produce deformation under the action of an external field, and density distribution of the plurality of image sensor pixels is correspondingly adjusted through the deformation.

In another aspect, example embodiments of the present application further provide an image sensor pixel density adjustment method, comprising:

making an external field acting on a controllable deformed material portion, the controllable deformed material portion being connected with a plurality of image sensor pixels array-distributed; and
controlling the controllable deformed material portion to produce corresponding deformation by adjusting distribution of the external field, and correspondingly adjusting density distribution of the plurality of image sensor pixels through the deformation.

In another aspect, a computer readable storage device comprising executable instructions that, in response to execution, cause a device comprising a processor to perform operations, comprising:

applying an external field to a controllable deformed material portion, wherein the controllable deformed material portion is connected with array-distributed image sensor pixels; and
controlling the controllable deformed material portion to produce deformation of the controllable deformed material portion, wherein the controlling comprises adjusting a distribution of the external field and adjusting a density distribution of the array-distributed image sensor pixels via the deformation.

Technical solutions of example embodiments of the present application, by controlling a controllable deformed material portion to produce corresponding deformation by adjusting distribution of an external field acting on the controllable deformed material portion and correspondingly adjusting density distribution of the plurality of image sensor pixels through the deformation, can achieve adjustable pixel density of the image sensor, performs image acquisition based on the image sensor with adjustable pixel density, and/or can make full use of overall pixels of the image sensor to present differentiated resolution of different regions of an acquired image, thereby better meeting users' diversified application demands.

These and other advantages of the present application will be more evident through the following detailed description about alternative embodiments of the present application with reference to the accompanying drawings.

BRIEF DESCRIPTION OF THE DRAWINGS

The present application can be better understood with reference to the description given below in combination with the accompanying drawings, in which the same or similar reference signs are used in all the drawings to indicate the same or similar components. The drawings together with the following detailed description are included in the specification and form a part of the specification, and are configured to further exemplify alternative embodiments of the present application and explain the principle and advantages of the present application. In the drawings.

Figure 1:
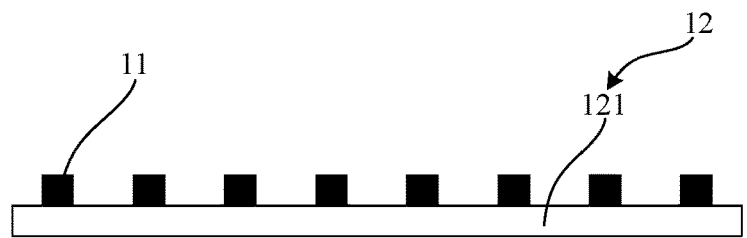
FIG. 1 is a schematic structural diagram of a first image sensor with adjustable pixel density according to one example embodiment of the present application.

Those skilled in the art should understand that, elements in the drawings are merely illustrated for the sake of simplicity and clarity, and may not be drawn to scale. For example, sizes of certain elements in the drawings may be amplified relative to other elements, so as to help to improve the understanding about the embodiments of the present application.

DETAILED DESCRIPTION

Example embodiments of the present application are described below in detail with reference to the accompanying drawings. For the sake of clarity and simplicity, not all the features of actual embodiments are described in the specification. However, it should be understood that, lots of decisions specific to implementations can be made during development of any such actual embodiment, so as to achieve specific goals of developers, for example, restrictions relevant to systems and services are met, and the restrictions may vary with different implementations. In addition, it should also be understood that, although development work is likely to be very complicated and time-consuming, for those skilled in the art who benefit from the disclosure, the development work is merely a routine task.

Herein, it should also be noted that, in order to avoid blurring the present application due to unnecessary details, only apparatus structures and/or processing steps closely related to solutions according to the present application are described in the accompanying drawings and the specification, but representation and description about members and processing having little to do with the present application and known to those of ordinary skill in the art are omitted.

Example embodiments of the present application are described in detail hereinafter with reference to the accompanying drawings and embodiments (in which the same elements are denoted by the same reference numerals). The following embodiments are intended to describe the present application, but not to limit the scope of the present application.

It should be understood by those skilled in the art that the terms such as "first" and "second" in the present application are merely intended to distinguish different steps, devices or modules, etc., which neither represent any particular technical meaning nor indicate a necessary logical sequence between them.

FIG. 1 is a schematic structural diagram of a first image sensor with adjustable pixel density according to one embodiment of the present application. As shown in FIG. 1, the image sensor with adjustable pixel density according to the embodiment of the present application comprises: a plurality of image sensor pixels 11 and a controllable deformed material portion 12, wherein the image sensor performs image acquisition through the image sensor pixels 11, the plurality of image sensor pixels 11 are array-distributed, and the controllable deformed material portion 12 is respectively connected with the plurality of image sensor pixels 11; the controllable deformed material portion 12 can produce deformation under the action of an external field, and density distribution of the plurality of image sensor pixels 11 is correspondingly adjusted through the deformation of the controllable deformed material portion 12.

In example technical solutions provided in the embodiments of the present application, the controllable deformed material portion can produce deformation by changing a certain external field effect factor on the controllable deformed material portion, when the certain external field effect factor is cancelled or changed, the deformation of the controllable deformed material portion can be restored, and a corresponding control external field acting thereon may be selected as the external field with respect to deformation characteristics of the controllable deformed material portion, for example, the external field comprises, but is not limited to, an external electric field, a magnetic field, a light field and the like. The image sensor pixels may comprise, but are not limited to, at least one photoelectric conversion unit. Each of the image sensor pixels and the controllable deformed material portion may be closely connected in a manner which comprises, but is not limited to, adhesion, in this way, when the controllable deformed material portion produces deformation, spacing between the image sensor pixels will be adjusted correspondingly, thus changing density distribution of the image sensor pixels and achieving the effect of giving differentiated pixel density distribution to different regions of the image sensor according to actual requirements.

During actual applications, an unevenly distributed external field can act on different regions of the controllable deformed material portion, to cause different regions of the controllable deformed material portion to produce deformation differently, thus adjusting the overall density distribution of the image sensor pixels. Optionally, the external field can act on a region where the controllable deformed material portion and the plurality of image sensor pixels do not overlap, to cause a region where the controllable deformed material portion and the plurality of image sensor pixels overlap not to produce deformation, the density distribution of the image sensor pixels is changed through deformation of other parts of the controllable deformed material portion, and the solution helps to avoid damage to the image sensor pixels caused by deformation of the controllable deformed material portion.

During actual applications, at least one suitable controllable deformed material can be selected as required to prepare the controllable deformed material portion, to cause the controllable deformed material portion to have characteristics of being deformable and having recoverable deformation. Optionally, the controllable deformed material portion is at least prepared from at least one or more of the following controllable deformed materials: piezoelectric materials, electroactive polymers, photodeformation materials and magnetostriction materials.

The piezoelectric materials may produce mechanical deformation due to the action of an electric field. The controllable deformed material portion prepared from the piezoelectric materials is hereinafter referred to as a piezoelectric material portion. By use of such a physical property of the piezoelectric material, the embodiment of the present application can determine electric field control information configured to make the piezoelectric material portion produce corresponding mechanical deformation according to, but not limited to, target pixel density distribution information, control an electric field acting on the piezoelectric material portion according to the electric field control information, to cause the piezoelectric material portion to produce corresponding mechanical deformation, and correspondingly adjust pixel density distribution of the image sensor through the mechanical deformation of the piezoelectric material portion, thus achieving the purpose of adjusting pixel density distribution of the image sensor according to the target pixel density distribution information. The piezoelectric materials may comprise, but are not limited to, at least one of the following: piezoelectric ceramic and piezoelectric crystal. The solution can make full use of the physical property of the piezoelectric material to adjust pixel density distribution of the image sensor.

The Electroactive Polymers (referred to as EAPs) are one kind of polymer materials that can change their shapes or sizes under the action of an electric field. The controllable deformed material portion prepared from the EAPs is hereinafter referred to as an EAP portion. By use of such a physical property of the EAPs, the embodiment of the present application can determine electric field control information configured to make the EAP portion produce corresponding deformation according to, but not limited to, target pixel density distribution information, control an electric field acting on an EAP layer according to the electric field control information, to cause the EAP layer to produce corresponding deformation, and correspondingly adjust pixel density distribution of the image sensor through the deformation of the EAP layer, thus achieving the purpose of adjusting pixel density distribution of the image sensor according to the target pixel density distribution information. The EAP materials may comprise, but are not limited to, at least one of the following: electronic EAPs and ionic EAPs; the electronic EAPs comprise at least one of the following: ferroelectric polymers (such as polyvinylidene fluoride), electrostrictive grafted elastomers and liquid crystal elastomers; and the ionic EAPs comprise at least one of the following: electrorheological fluids, ionic polymer-metallic composite materials and the like. The solution can make full use of the physical property of the EAPs to adjust pixel density distribution of the image sensor.

The photodeformation materials are one kind of polymer materials that can change their shapes or sizes under the action of a light field. The controllable deformed material portion prepared from the photodeformation materials is hereinafter referred to as a photodeformation material portion. By use of such a physical property of the photodeformation materials, the embodiment of the present application can determine light field control information configured to make the photodeformation material portion produce corresponding deformation according to, but not limited to, target pixel density distribution information, control a light field acting on the photodeformation material portion according to the light field control information, to cause the photodeformation material portion to produce corresponding deformation, and correspondingly adjust pixel density distribution of the image sensor through the deformation of the photodeformation material portion, thus achieving the purpose of adjusting pixel density distribution of the image sensor according to the target pixel density distribution information. The photodeformation materials may comprise, but are not limited to, at least one of the following: photostrictive ferroelectric ceramics and photodeformation polymers; the photostrictive ferroelectric ceramics comprise, but are not limited to, lead lanthanum zirconate titanate (PLZT) ceramics, and the photodeformation polymers comprise, but are not limited to, photodeformation liquid crystal elastomers. The solution can make full use of the physical property of the photodeformation material to adjust pixel density distribution of the image sensor.

The magnetostriction materials are one kind of magnetic materials that can change a magnetization state thereof under the action of a magnetic field and then change their sizes. The controllable deformed material portion prepared from the magnetostriction materials is hereinafter referred to as a magnetostriction material portion. By use of such a physical property of the magnetostriction materials, the embodiment of the present application can determine magnetic field control information configured to make the magnetostriction material produce corresponding deformation according to, but not limited to, target pixel density distribution information, control a magnetic field acting on the magnetostriction material portion according to the magnetic field control information, to cause the magnetostriction material portion to produce corresponding deformation, and correspondingly adjust pixel density distribution of the image sensor through the deformation of the magnetostriction material portion, thus achieving the purpose of adjusting pixel density distribution of the image sensor according to the target pixel density distribution information. The magnetostriction materials may comprise, but are not limited to, rare-earth giant magnetostrictive materials, such as alloy $Tbo_{0.3}Dy_{0.7}Fe_{1.95}$ materials using a $(Tb,Dy)Fe_2$ compound as a substrate. The solution can make full use of the physical property of the magnetostriction material to adjust pixel density distribution of the image sensor.

In example technical solutions provided in the embodiments of the present application, specific structures and connecting modes of the image sensor pixels and the controllable deformed material portion can be determined according to actual requirements, and the actual modes are very flexible.

In one example embodiment, as shown in FIG. 1, the controllable deformed material portion 12 comprises: a controllable deformed material layer 121, the plurality of image sensor pixels 11 being array-distributed and connected to one side of the controllable deformed material layer 121. Optionally, it is feasible to choose to directly form the plurality of image sensor pixels on the controllable deformed material portion 12 according to actual process conditions, or the plurality of image sensor pixels and the controllable deformed material portion 12 can be prepared respectively and can be closely connected in a manner which comprises, but is not limited to, adhesion. The solution has a simple structure and is easy to achieve.

Figure 2:
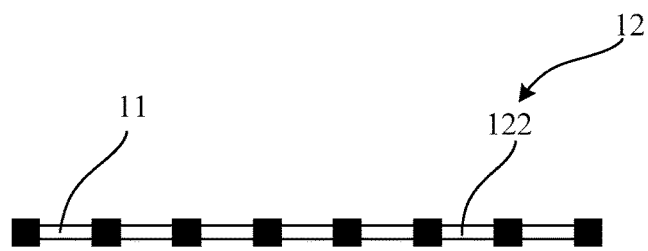
FIG. 2 is a schematic structural diagram of a second image sensor with adjustable pixel density according to one example embodiment of the present application.

In another example embodiment, as shown in FIG. 2, the controllable deformed material portion 12 comprises a plurality of controllable deformed material connecting sub-portions 122, the plurality of controllable deformed material connecting sub-portions 122 being array-distributed, so as to correspondingly connect the plurality of image sensor pixels 11 array-distributed, that is, the plurality of image sensor pixels array-distributed are connected into one piece through the plurality of controllable deformed material connecting sub-portions array-distributed. Optionally, the plurality of controllable deformed material connecting sub-portions can be formed in spacer regions between pixels of an image sensor pixel array according to an actual process, and the plurality of controllable deformed material connecting sub-portions and the corresponding image sensor pixels may be connected in a manner which comprises, but is not limited to, abutment and adhesion. The density distribution of the image sensor pixels can be adjusted by controlling deformation of the plurality of controllable deformed material connecting sub-portions, the structure is simple, and implementation is easy.

Figure 3:
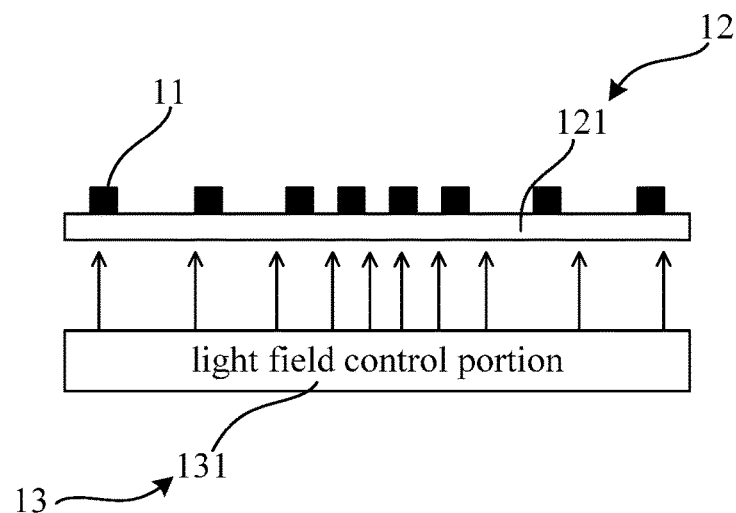
FIG. 3 is a schematic structural diagram of a third image sensor with adjustable pixel density according to one example embodiment of the present application.
Figure 4:
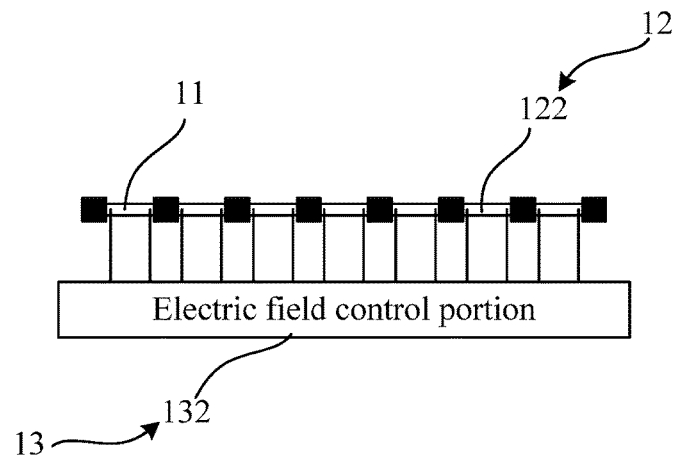
FIG. 4 is a schematic structural diagram of a fourth image sensor with adjustable pixel density according to one example embodiment of the present application.

Further, as shown in FIG. 3 and FIG. 4, the image sensor may further comprise: a deformation control portion 13, wherein the deformation control portion 13 is configured to adjust distribution of the external field acting on the controllable deformed material portion 12, so as to control the controllable deformed material portion 12 to produce corresponding deformation, in this way, when the controllable deformed material portion 12 produces deformation, the spacing between the image sensor pixels 11 may be adjusted correspondingly, thus changing density distribution of the image sensor pixels 11 and achieving the effect of giving differentiated pixel density distribution to different regions of the image sensor according to actual requirements.

Optionally, as shown in FIG. 3, the deformation control portion comprises a light field control portion 131, wherein the light field control portion 131 is configured to adjust distribution of an external light field acting on the controllable deformed material portion 12, so as to control the controllable deformed material portion 12 to produce corresponding deformation. In this case, the controllable deformed material portion 12 may comprise a photodeformation material portion at least prepared from photodeformation materials, for example, the photodeformation material portion may comprise a photodeformation material layer at least prepared from the photodeformation materials, or the controllable deformed material portion may comprise a plurality of photodeformation material connecting sub-portions at least prepared from the photodeformation materials. The light field control portion 131 excites different regions of the controllable deformed material portion 12 to produce deformation differently by changing light field distribution acting on the photodeformation material portion (in FIG. 3, the light field with different intensity distribution acting on the controllable deformed material portion 12 is represented through arrow density), and the spacing between the image sensor pixels 11 is adjusted correspondingly through the deformation of the controllable deformed material portion 12, thus changing density distribution of the image sensor pixels 11 and achieving the effect of giving differentiated pixel density distribution to different regions of the image sensor according to actual requirements.

Figure 5:
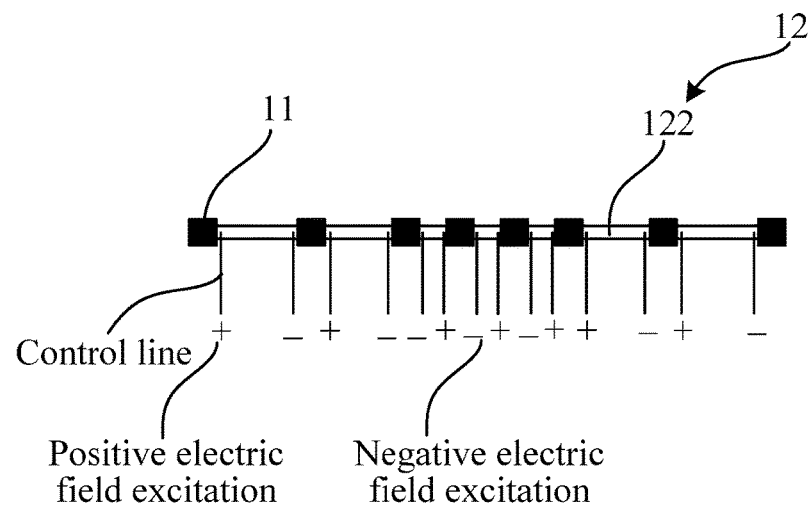
FIG. 5 is an example of a scenario where an image sensor adjusts pixel density in the event of uneven light field excitation according to one example embodiment of the present application.

Optionally, as shown in FIG. 4, the deformation control portion comprises an electric field control portion 132, wherein the electric field control portion 132 is configured to adjust distribution of an external electric field acting on the controllable deformed material portion, so as to control the controllable deformed material portion to produce corresponding deformation. In this case, the controllable deformed material portion 12 may comprise a piezoelectric material portion at least prepared from piezoelectric materials (such as a piezoelectric material layer or a piezoelectric material connecting sub-portion), or the controllable deformed material portion 12 may comprise an EAP portion at least prepared from EAPs (such as an EAP layer or an EAP connecting sub-portion). As shown in FIG. 4, the electric field control portion and the controllable deformed material can be connected through a control line, and the electric field control portion 132 excites different regions of the controllable deformed material portion 12 to produce deformation differently by changing electric field distribution acting on the controllable deformed material portion. If the electric field acting on the controllable deformed material portion 12 is a zero field, the controllable deformed material portion does not produce deformation (might as well be called zero field excitation); if intensity distribution of the electric field acting on the controllable deformed material portion 12 (for example, "+" positive electric field excitation and "−" negative electric field excitation shown in FIG. 4) is changed to cause the intensity of the electric field acting on different regions of the controllable deformed material portion 12 to vary, as shown in FIG. 5, in this way, the different regions of the controllable deformed material portion 12 may produce deformation differently, and the spacing between the image sensor pixels 11 is adjusted correspondingly through the deformation of the controllable deformed material portion 12, thus changing the overall pixel density distribution of the image sensor pixels 11 and achieving the effect of giving differentiated pixel density distribution to different regions of the image sensor according to actual requirements.

In the embodiments of the present application, the controllable deformed portion and the deformation control portion may be directly or indirectly connected. The deformation control portion may serve as a part of the image sensor, or the deformation control portion may not serve as a part of the image sensor, and the image sensor may also be connected with the deformation control portion through a reserved pin or interface or the like. The external field acting on the controllable deformed material portion may comprise, but is not limited to, an electric field, a magnetic field, a light field and the like. A hardware or software structure configured to produce the electric field, a hardware or software structure configured to produce the magnetic field, a hardware or software structure configured to produce the light field and the like can be achieved by using corresponding existing technologies according to actual requirements, which is no longer repeated herein in the embodiment of the present application.

Figure 6:
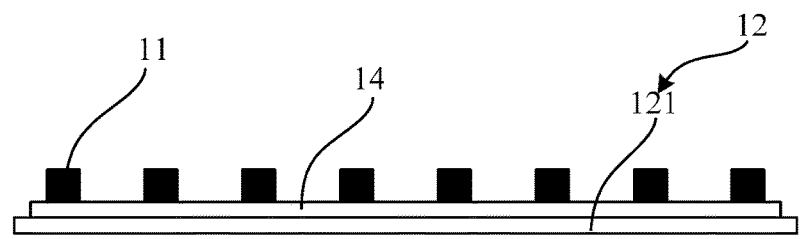
FIG. 6 is a schematic structural diagram of a fifth image sensor with adjustable pixel density according to one example embodiment of the present application.
Figure 7:
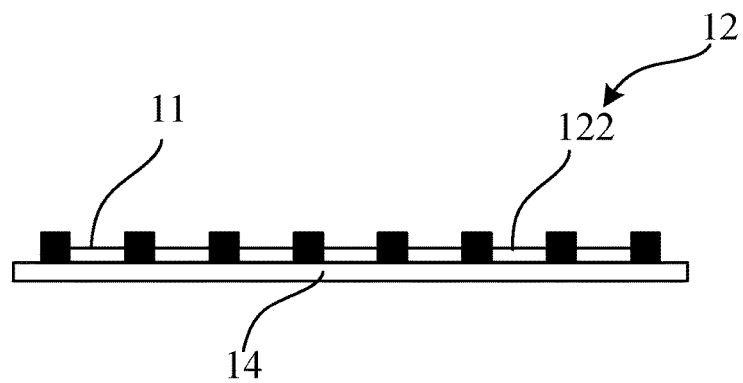
FIG. 7 is a schematic structural diagram of a sixth image sensor with adjustable pixel density according to one example embodiment of the present application.

Optionally, the image sensor may further comprise a flexible substrate, and the flexible substrate may comprise, but is not limited to, a flexible plastic substrate, which has certain flexibility and can change the shape of the flexible substrate according to requirements. The image sensor pixels and the controllable deformed material portion may be disposed on the same side or different sides of the flexible substrate. For example, as shown in FIG. 6, the plurality of image sensor pixels 11 are connected to one side of the flexible substrate 14, and the controllable deformed material portion (for example, the controllable deformed material layer 121) is connected to the other side of the flexible substrate 14. For another example, as shown in FIG. 7, the plurality of image sensor pixels 11 are connected to one side of the flexible substrate 14, and the controllable deformed material portion (for example, the controllable deformed material connecting sub-portion 122) is connected to the corresponding image sensor pixel and is located on the same side of the flexible substrate 14 with the image sensor pixel 11. The solution not only can indirectly adjust the overall pixel density distribution of the image sensor by controlling its deformation through the external field acting on the controllable deformed material portion, to achieve adjustable pixel density of the image sensor, but also can flexibly change the shape of the image sensor due to use of the flexible substrate, for example, a plane image sensor is bent to a certain angle to obtain a surface image sensor, thus meeting application demands such as diversified image acquisition and decoration.

Figure 8:
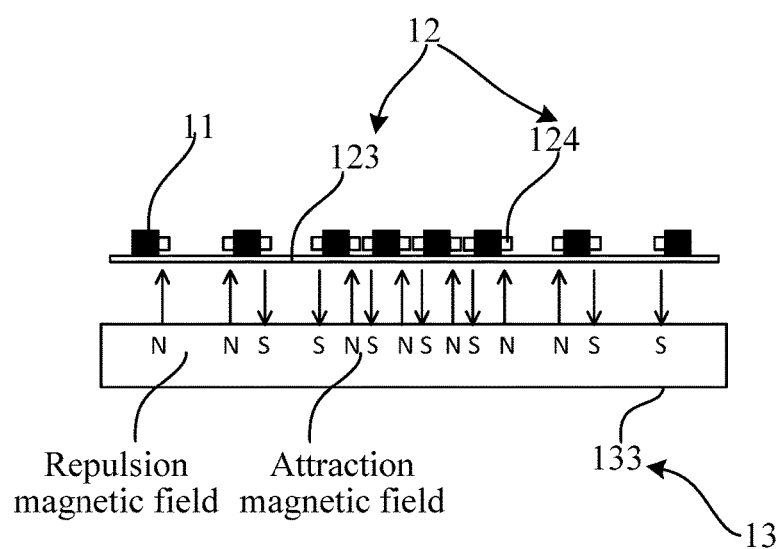
FIG. 8 is a schematic structural diagram of a seventh image sensor with adjustable pixel density according to one example embodiment of the present application.

FIG. 8 is a schematic structural diagram of a seventh image sensor with adjustable pixel density according to one embodiment of the present application. In the image sensor as shown in FIG. 8, the controllable deformed material portion 12 comprises: a flexible substrate 123 and a plurality of permeability magnetic material portions 124; the plurality of image sensor pixels 11 are respectively connected with the flexible substrate 123, at least a part of the image sensor pixels 11 are connected with the plurality of permeability magnetic material portions 124, the flexible substrate 123 produces corresponding deformation by changing a magnetic field acting on the permeability magnetic material portions 124, and density distribution of the plurality of image sensor pixels 11 is correspondingly adjusted through the deformation. For example, a permeability magnetic material portion 124 can be disposed on a side face of each image sensor pixel, and optionally, the image sensor pixel 11 is respectively adhered to the flexible substrate 123 and the permeability magnetic material portion 124. The permeability magnetic material portion may comprise a magnetic pole prepared from a permeability magnetic material, and the permeability magnetic material may comprise, but is not limited to, one or more of a soft magnetic material, a silicon steel sheet, a permalloy, ferrite, an amorphous soft magnetic alloy, and a super-microcrystalline soft magnetic alloy. The permeability magnetic material portion prepared from the soft magnetic material has better permeability, and small residual magnetization after cancellation of the magnetic field facilitates next adjustment.

Further, optionally, the deformation control portion 13 in the embodiment of the present application may further comprise: a magnetic field control portion 133, wherein the magnetic field control portion 133 is configured to adjust distribution of an external magnetic field acting on the controllable deformed material portion, so as to control the controllable deformed material portion to produce corresponding deformation. For example, when the magnetic field control portion 133 controls the magnetic field (that is, excitation magnetic field) acting on the permeability magnetic material portion 124, as shown in FIG. 8, a like magnetic pole (NN or SS) repulsion magnetic field or an unlike magnetic pole (NS or SN) attraction magnetic field with certain magnetic field intensity distribution is applied between adjacent image sensor pixels, the poles may produce a corresponding repelling force or attracting force therebetween, the magnetic force is transferred to the flexible substrate 123 to make the flexible substrate 123 product deformation such as expansion and contraction, thereby resulting in that the spacing between the corresponding image sensor pixels changes and achieving the purpose of adjusting pixel density distribution of the image sensor. The solution achieves adjustable pixel density distribution of the image sensor in combination with scalable deformation characteristics of the flexible substrate and the magnetic field control principle.

Figure 9:
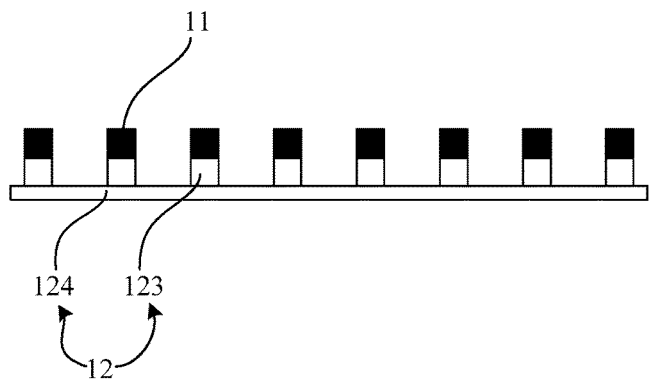
FIG. 9 is a schematic structural diagram of an eighth image sensor with adjustable pixel density according to one example embodiment of the present application.

FIG. 9 is a schematic structural diagram of an eighth image sensor with adjustable pixel density according to one embodiment of the present application. In the image sensor as shown in FIG. 9, the controllable deformed material portion 12 comprises: a flexible substrate 123 and a plurality of permeability magnetic material portions 124; one side of the plurality of permeability magnetic material portions 124 is respectively connected with the flexible substrate 123, an opposite face of the plurality of permeability magnetic material portions 124 is respectively connected with the plurality of image sensor pixels 11 correspondingly, the flexible substrate 123 produces corresponding deformation by changing a magnetic field acting on the permeability magnetic material portions 124, and density distribution of the plurality of image sensor pixels 11 is correspondingly adjusted through the deformation. Optionally, the permeability magnetic material portions 124 are adhered to the flexible substrate 123, the image sensor pixels 11 are adhered to the permeability magnetic material portions 124, and when the magnetic field acting on the permeability magnetic material portions 124 changes, the magnetic force is transferred to the flexible substrate 123 to make the flexible substrate 123 product deformation such as expansion and contraction, thereby achieving the purpose of adjusting pixel density distribution of the image sensor. The solution achieves adjustable pixel density distribution of the image sensor in combination with scalable deformation characteristics of the flexible substrate and the magnetic field control principle.

Figure 10:
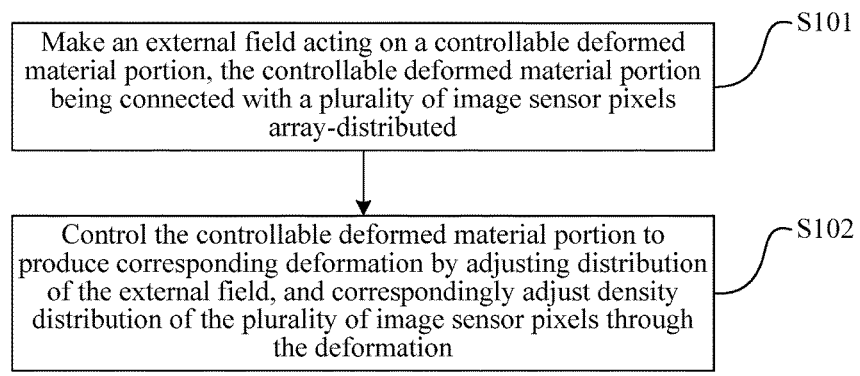
FIG. 10 is a flowchart of an image sensor pixel density adjustment method according to one example embodiment of the present application.

FIG. 10 is a flowchart of an image sensor pixel density adjustment method according to one embodiment of the present application. As shown in FIG. 10, an image sensor pixel density adjustment method provided in the embodiment of the present application comprises:

S101: Make an external field acting on a controllable deformed material portion, the controllable deformed material portion being connected with a plurality of image sensor pixels array-distributed.

S102: Control the controllable deformed material portion to produce corresponding deformation by adjusting distribution of the external field, and correspondingly adjust density distribution of the plurality of image sensor pixels through the deformation.

During actual applications, an unevenly distributed external field can act on different regions of the controllable deformed material portion, to cause different regions of the controllable deformed material portion to produce deformation differently, thus adjusting the overall density distribution of the image sensor pixels.

Optionally, the making an external field acting on a controllable deformed material portion comprises: making the external field acting on a region where the controllable deformed material portion and the plurality of image sensor pixels do not overlap. The solution causes a region where the controllable deformed material portion and the image sensor pixels overlap not to produce deformation, but changes density distribution of the image sensor pixels through deformation of other parts of the controllable deformed material portion, thus facilitating avoiding damage to the image sensor pixels caused by deformation of the controllable deformed material portion.

Optionally, the controllable deformed material portion is at least prepared from one or more of the following controllable deformed materials: piezoelectric materials, electroactive polymers, photodeformation materials and magnetostriction materials. Through the material selection, the controllable deformed material portion has characteristics of being deformable and having recoverable deformation.

Optionally, the controlling the controllable deformed material portion to produce corresponding deformation by adjusting distribution of the external field comprises: controlling the controllable deformed material portion to produce corresponding deformation by adjusting distribution of an external electric field. In this case, the controllable deformed material portion may be at least made from piezoelectric materials or EAPs. By changing distribution of an electric field acting on the controllable deformed material portion, different regions of the controllable deformed material portion are excited to produce deformation differently, thus changing the overall pixel density distribution of the image sensor and achieving the effect of giving differentiated pixel density distribution to different regions of the image sensor according to actual requirements.

Optionally, the controlling the controllable deformed material portion to produce corresponding deformation by adjusting distribution of the external field comprises: controlling the controllable deformed material portion to produce corresponding deformation by adjusting distribution of an external light field. In this case, the controllable deformed material portion may be at least made from photodeformation materials. By changing distribution of a light field acting on the photodeformation material portion, different regions of the controllable deformed material portion are excited to produce deformation differently, and the spacing between the image sensor pixels is adjusted correspondingly through the deformation of the controllable deformed material portion, thus changing the density distribution of the image sensor pixels and achieving the effect of giving differentiated pixel density distribution to different regions of the image sensor according to actual requirements.

Optionally, the controlling the controllable deformed material portion to produce corresponding deformation by adjusting distribution of the external field comprises: controlling the controllable deformed material portion to produce corresponding deformation by adjusting distribution of an external magnetic field. In this case, the controllable deformed material portion may be at least made from magnetostrictive materials. By changing distribution of a magnetic field acting on the magnetostrictive material portion, different regions of the magnetostrictive material portion are excited to produce deformation differently, and the spacing between the image sensor pixels is adjusted correspondingly through the deformation of the magnetostrictive material portion. Alternatively, in this case, the controllable deformed material portion comprises a flexible substrate and a plurality of permeability magnetic material portions, and the flexible substrate is controlled to produce corresponding deformation by changing distribution of a magnetic field acting on the permeability magnetic material portions, thus correspondingly adjusting the spacing between the image sensor pixels. The solutions all can change density distribution of the image sensor pixels, thereby achieving the effect of giving differentiated pixel density distribution to different regions of the image sensor according to actual requirements.

It should be understood by those skilled in the art that, in any one of the foregoing methods of the example embodiments of the present application, the value of the serial number of each step described above does not mean an execution sequence, and the execution sequence of each step should be determined according to the function and internal logic thereof, and should not be any limitation to the example embodiments of the present application. The image sensor pixel density adjustment method provided in the embodiment of the present application can be achieved through hardware control or software control, which is not limited in the present application.

By use of the technical solutions provided in the embodiments of the present application, adjustable pixel density of the image sensor can be achieved, image acquisition is performed based on the image sensor with adjustable pixel density, and overall pixels of the image sensor can be fully used to present differentiated resolution of different regions of an acquired image, thereby better meeting users' diversified application demands. The image sensor with adjustable pixel density may be applied to, for example, devices having an image acquisition function such as taking pictures, photographing, camera shooting and video monitoring, which, for example, can be applied to, but not limited to, the following devices, cameras, mobile phones, webcams, video cameras, video cassette recorders, and so on.

In one optional application scenario, target pixel density distribution information of an image to be acquired can be obtained, distribution of an external field acting on the controllable deformed material portion is determined according to the target pixel density distribution information, the controllable deformed material portion produces deformation through the external field acting on the controllable deformed material portion, the original spacing between the image sensor pixels is changed through the deformation of the controllable deformed material portion, that is, pixel density distribution of the image sensor is adjusted, and then image acquisition is performed based on the image sensor after adjustment of the pixel density.

The target pixel density distribution information of the image to be acquired is usually configured to represent a user's or device's relative expectation for image resolution of different regions of the image to be acquired. For example, for a region having higher expectation for the image resolution of the image to be acquired, target pixel density corresponding to the region is greater, so as to achieve acquisition of an image in the region through super resolution; for the image to be acquired in other regions, requirements for image quality and resolution can be reduced properly, and images in the other regions can be acquired through down-sampling. In this way, respective target pixel density corresponding to the different regions of the image to be acquired varies.

The image to be acquired is acquired by using the image sensor with adjustable pixel density provided in the embodiment of the present application, the overall pixels of the image sensor can be fully used, equivalent to adjusting the existing pixel density distribution of the image sensor correspondingly according to the target pixel density distribution information, to cause adjusted pixel density distribution of the flexible image sensor to correspond to the target pixel density distribution information, or, to cause adjusted pixel density distribution of the flexible image sensor to be close to the target pixel density distribution information as much as possible, thereby achieving the effect of giving different pixel density to different regions for image acquisition, and to cause definition of different regions of the acquired image to vary, for example, the part of the region of the image sensor with large pixel density corresponding to the acquired image has higher image resolution and more abundant details, while the part of the region of the image sensor with small pixel density corresponding to the acquired image has lower image resolution and less abundant details. The overall size of the acquired image equals to that of the image acquired by the image sensor in the event that the pixel density distribution is not adjusted. In this way, differentiated resolution of different regions of the same acquired image is presented, which helps to improve efficiency of image acquisition while not increasing the size of the image, facilitates intuitive display of the image and better meets users' diversified application demands.

In order to further reduce pressure of image storage resources and/or transmission bandwidth resources, the image acquired (might as well be called image originally acquired) after pixel density adjustment is performed on the image sensor provided in the embodiment of the present application can be compressed to reduce the size of the image, for example, the acquired image is down-sampled according to a certain down-sampling rate, so the size of the image can be reduced, and even if the part originally acquired through the regions of the image sensor with large pixel density (these regions are usually regions more important or more meaningful to users) is down-sampled, definition loss of the image is relatively small, thereby helping to improve image display efficiency of the part and improving users' visual experience. In addition, if it is necessary to amplify the image originally acquired, as the part acquired through the regions of the image sensor with large pixel density has higher image resolution and more abundant image details, image processing with greater magnification can be supported, that is, post-processing of the image originally acquired is very convenient and flexible, which helps to relieve the pressure of image storage and/or transmission bandwidth and can better meet users' diversified application demands.

In the various embodiments of the present application, the serial numbers and/or sequence numbers of the foregoing embodiments are merely for the convenience of description, and do not imply the preference among the embodiments. Particular emphasis is put on the description about each embodiment, and reference can be made to relevant description of other embodiments for the content not detailed in a certain embodiment. Reference can be made to the description about the corresponding method embodiments for related description about the implementation principle or process of relevant image sensors, and reference can be made to the description about the corresponding image sensor embodiments for the structure of the image sensors involved in relevant method embodiments, which is not repeated herein.

It can be appreciated by those of ordinary skill in the art that each exemplary unit and method step described with reference to the embodiments disclosed herein can be implemented by electronic hardware or a combination of computer software and electronic hardware. Whether these functions are executed in a hardware mode or a software mode depends on particular applications and design constraint conditions of the technical solution. The professional technicians can use different methods to implement the functions described with respect to each particular application, but such example embodiment should not be considered to go beyond the scope of the present application.

If the functions are implemented in the form of a software functional unit and is sold or used as an independent product, it can be stored in a computer-readable storage medium. Based on such understanding, the technical solution of the present application essentially or the part which contributes to the prior art or a part of the technical solution can be embodied in the form of a software product, and the computer software product is stored in a storage medium, and comprises several instructions for enabling a computer device (which can be a personal computer, a server, or a network device, and the like) to execute all or some steps of the method described in each embodiment of the present application. The foregoing storage medium comprises, a USB disk, a removable hard disk, a read-only memory (ROM), a random access memory (RAM), a magnetic disk, an optical disk or any other mediums that can be configured to store program codes.

In the embodiments of the apparatuses, methods and systems of the present application, it is apparent that the members (systems, sub-systems, modules, sub-modules, units, sub-units, and the like) or the steps can be decomposed, combined and/or recombined after decomposition. The decomposition and/or recombination should be regarded as equivalent solutions of the present application. Moreover, in the description about the embodiments of the present application, features described and/or illustrated with respect to one implementation may be used in one or more other implementations in the same or a similar manner, be combined with features in other implementations, or replace the features in other implementations.

It should be emphasized that, the term "comprise" used herein refers to existence of features, elements, steps or components, but does not exclude existence or addition of one or more other features, elements, steps or components.

Finally, it should be noted that, the above example embodiments are only intended to describe the present application rather than to limit the present application; various changes and variations can be made by those of ordinary skill in the art without departing from the spirit and scope of the present application, so all equivalent technical solutions also belong to the category of the present application, and the scope of patent protection of the present application should be defined by the claims.

What is claimed is:

1. An image sensor, comprising:
a plurality of image sensor pixels that is array-distributed; and
a controllable deformed material portion respectively connected with the plurality of image sensor pixels, wherein the controllable deformed material portion is controllable to produce deformation under action of an external field, and a density distribution of the plurality of image sensor pixels is correspondingly adjustable through the deformation.

2. The image sensor of claim 1, wherein the controllable deformed material portion comprises: a controllable deformed material layer, and wherein the plurality of image sensor pixels is connected to one side of the controllable deformed material layer.

3. The image sensor of claim 1, wherein the controllable deformed material portion comprises a plurality of controllable deformed material connecting sub-portions, and wherein the plurality of controllable deformed material connecting sub-portions are array-distributed, to correspondingly connect the plurality of image sensor pixels that are array-distributed.

4. The image sensor of claim 1, wherein the controllable deformed material portion is at least prepared from at least one of piezoelectric materials, electroactive polymers, photodeformation materials or magnetostriction materials.

5. The image sensor of claim 2, further comprising a flexible substrate, and wherein the plurality of image sensor pixels is connected to one side of the flexible substrate.

6. The image sensor of claim 5, wherein the controllable deformed material portion is connected to another side of the flexible substrate.

7. The image sensor of claim 1, wherein the controllable deformed material portion comprises: a flexible substrate and a plurality of permeability magnetic material portions,
wherein the plurality of image sensor pixels is respectively connected with the flexible substrate, at least a part of the image sensor pixels is connected with the plurality of permeability magnetic material portions,
wherein the flexible substrate produces the deformation by changing a magnetic field acting on the permeability magnetic material portions, and wherein the density distribution of the plurality of image sensor pixels is correspondingly adjusted through the deformation.

8. The image sensor of claim 1, wherein the controllable deformed material portion comprises: a flexible substrate and a plurality of permeability magnetic material portions,
wherein one side of the plurality of permeability magnetic material portions is respectively connected with the flexible substrate,
wherein an opposite face of the plurality of permeability magnetic material portions is respectively connected with the plurality of image sensor pixels correspondingly,
wherein the flexible substrate produces the deformation by changing a magnetic field acting on the permeability magnetic material portions, and
wherein the density distribution of the plurality of image sensor pixels is correspondingly adjusted through the deformation.

9. The image sensor of claim 1, further comprising:
a deformation control portion configured to adjust a distribution of the external field acting on the controllable deformed material portion, to control the controllable deformed material portion to produce the deformation.

10. The image sensor of claim 9, wherein the deformation control portion comprises:
an electric field control portion configured to adjust the distribution of an external electric field acting on the controllable deformed material portion, to control the controllable deformed material portion to produce the deformation.

11. The image sensor of claim 9, wherein the deformation control portion comprises:
a light field control portion configured to adjust the distribution of an external light field acting on the controllable deformed material portion, to control the controllable deformed material portion to produce the deformation.

12. The image sensor of claim 9, wherein the deformation control portion comprises:
a magnetic field control portion configured to adjust the distribution of an external magnetic field acting on the controllable deformed material portion, to control the controllable deformed material portion to produce the deformation.

13. A method, comprising:
applying, by a device, an external field to act on a controllable deformed material portion, wherein the controllable deformed material portion is connected with an array-distributed plurality of image sensor pixels;
controlling the controllable deformed material portion to produce corresponding deformation by adjusting a distribution of the external field; and
correspondingly to the controlling, adjusting a density distribution of the array-distributed plurality of image sensor pixels through the corresponding deformation.

14. The method of claim 13, wherein the applying the external field to act on the controllable deformed material portion comprises:
applying the external field to act on a region where the controllable deformed material portion and the array-distributed plurality of image sensor pixels do not overlap.

15. The method of claim 13, wherein the controllable deformed material portion is at least prepared from at least one of: piezoelectric materials, electroactive polymers, photodeformation materials or magnetostriction materials.

16. The method of claim 13, wherein the controlling the controllable deformed material portion to produce the corresponding deformation by adjusting the distribution of the external field comprises:
controlling the controllable deformed material portion to produce the corresponding deformation by adjusting the distribution of an external electric field.

17. The method of claim 13, wherein the controlling the controllable deformed material portion to produce the corresponding deformation by adjusting the distribution of the external field comprises:
controlling the controllable deformed material portion to produce the corresponding deformation by adjusting the distribution of an external light field.

18. The method of claim 13, wherein the controlling the controllable deformed material portion to produce the corresponding deformation by adjusting the distribution of the external field comprises:
controlling the controllable deformed material portion to produce the corresponding deformation by adjusting the distribution of an external magnetic field.

19. A computer readable storage device comprising executable instructions that, in response to execution, cause a device comprising a processor to perform operations, comprising:
applying an external field to a controllable deformed material portion, wherein the controllable deformed material portion is connected with array-distributed image sensor pixels; and
controlling the controllable deformed material portion to produce deformation of the controllable deformed material portion, wherein the controlling comprises adjusting a distribution of the external field and adjusting a density distribution of the array-distributed image sensor pixels via the deformation.

20. The computer readable storage device of claim 19, wherein the controlling the controllable deformed material portion comprises:
controlling the controllable deformed material portion to produce the deformation by adjusting the distribution of at least one of an external magnetic field, an external light field or an external electric field.

* * * * *